US008660172B2

(12) United States Patent
Yoshida et al.

(10) Patent No.: US 8,660,172 B2
(45) Date of Patent: Feb. 25, 2014

(54) PULSE SIGNAL RECEIVING APPARATUS AND TRANSMISSION SYSTEM

(75) Inventors: Yoshio Yoshida, Tokyo (JP); Noriaki Kihara, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 117 days.

(21) Appl. No.: 13/313,887

(22) Filed: Dec. 7, 2011

(65) Prior Publication Data
US 2012/0155524 A1 Jun. 21, 2012

(30) Foreign Application Priority Data

Dec. 9, 2010 (JP) ................................ P2010-274949

(51) Int. Cl.
*H03K 7/08* (2006.01)
(52) U.S. Cl.
USPC ........... 375/238; 375/239; 375/242; 375/360; 375/371; 329/312
(58) Field of Classification Search
USPC ......... 375/237–239, 242, 243, 254, 360, 371; 329/312, 313
See application file for complete search history.

(56) References Cited

U.S. PATENT DOCUMENTS

| 6,169,765 B1 * | 1/2001 | Holcombe ..................... 375/238 |
| 6,633,620 B2 * | 10/2003 | Taguchi et al. ................. 375/360 |
| 8,204,165 B2 * | 6/2012 | Ichiyama et al. ............. 375/354 |
| 2003/0027542 A1 | 2/2003 | Hediger et al. |
| 2005/0094496 A1 * | 5/2005 | Ozawa .......................... 368/184 |
| 2008/0317174 A1 * | 12/2008 | Karaki et al. ................. 375/343 |

FOREIGN PATENT DOCUMENTS

JP 09-084388 A 3/1997

OTHER PUBLICATIONS

European Search Report corresponding to European Patent Application No. 11192358.7, dated Jul. 25, 2012.

* cited by examiner

*Primary Examiner* — Dac Ha
(74) *Attorney, Agent, or Firm* — Sughrue Mion, PLLC

(57) ABSTRACT

A pulse signal receiving apparatus may include a reception unit that receives a pulse signal modulated by a double-edge modulation scheme, a measurement unit that measures an edge interval of the pulse signal, which has been received by the reception unit, a detection unit that detects a deviation of the edge interval, which has been measured by the measurement unit, for a pulse-width reference value indicating a reference value of a width of the pulse signal, a correction unit that corrects the edge interval, which is to be measured next by the measurement unit, by using the deviation, which has been detected by the detection unit, and a decoding unit that decodes the pulse signal, of which the edge interval has been corrected by the correction unit, so as to output a digital signal.

15 Claims, 6 Drawing Sheets

FIG. 2

| DIGITAL SIGNAL D1 | PULSE-WIDTH REFERENCE VALUE [nsec] |
|---|---|
| 00 | 600 |
| 01 | 700 |
| 10 | 800 |
| 11 | 900 |

FIG. 3

| | PULSE WIDTH W [nsec] | DIGITAL SIGNAL D2 |
|---|---|---|
| R1 | $550 \leq W < 650$ | 00 |
| R2 | $650 \leq W < 750$ | 01 |
| R3 | $750 \leq W < 850$ | 10 |
| R4 | $850 \leq W < 950$ | 11 |
| | $W < 550, 950 \leq W$ | BIT ERROR |

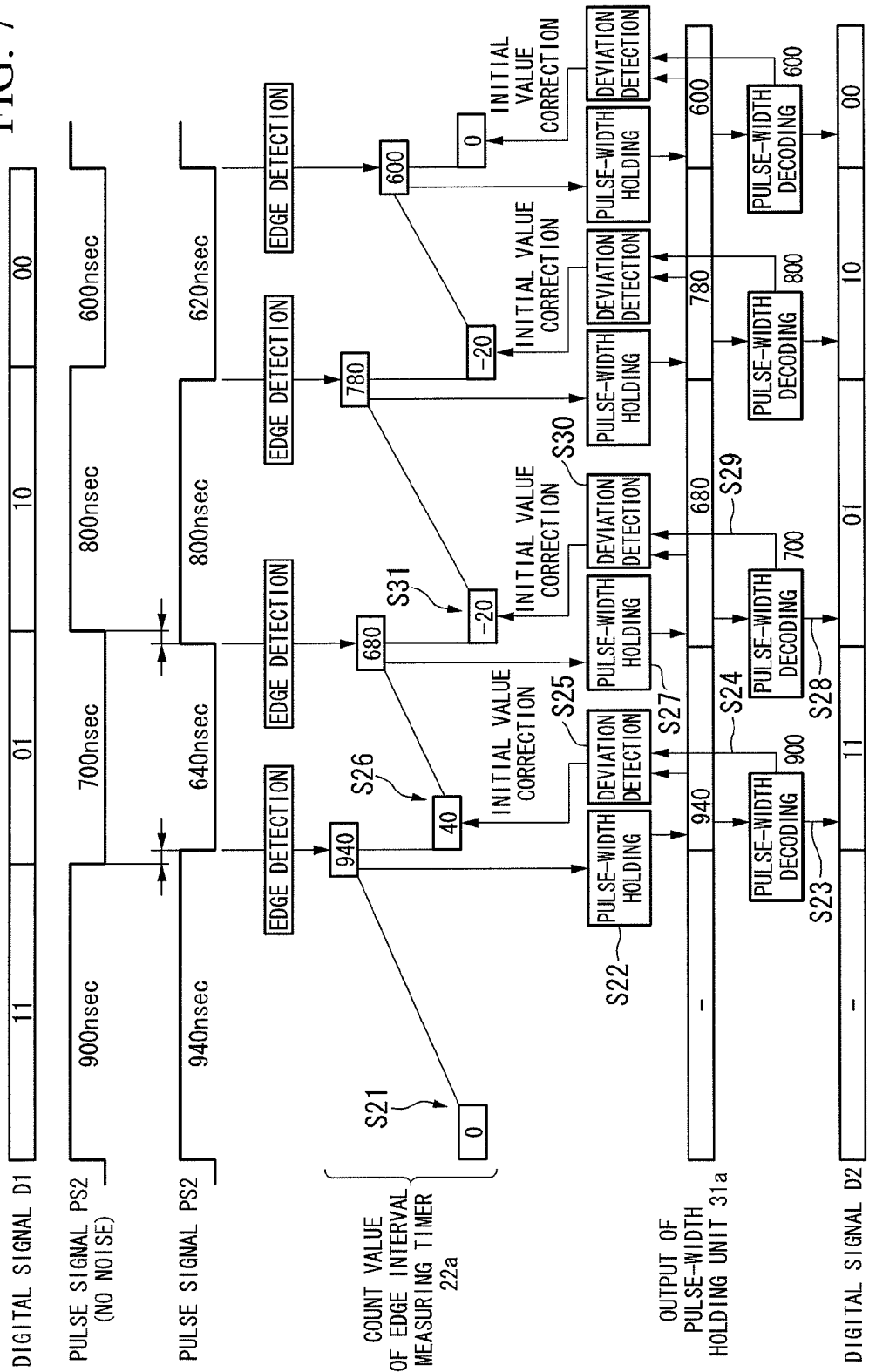

PULSE SIGNAL RECEIVING APPARATUS AND TRANSMISSION SYSTEM

BACKGROUND OF THE INVENTION

1. Field of the Invention

The present invention relates to a pulse signal receiving apparatus and a transmission system.

Priority is claimed on Japanese Patent Application No. 2010-274949, filed Dec. 9, 2010, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

As is well known, digital signal transmission schemes may be divided broadly into a baseband scheme and a broadband scheme. The baseband scheme is a transmission scheme in which a digital signal is directly transmitted without being modulated. The broadband scheme is a transmission scheme in which a digital signal is modulated into an analog signal and the analog signal is transmitted. Representative transmission schemes for use in the broadband scheme may be a pulse width modulation (PWM) scheme, a pulse amplitude modulation (PAM) scheme, a pulse position modulation (PPM) scheme, and the like.

In the related art, the PWM or PPM scheme is usually used in the field of power control or motor control. However, in recent years, the PWM or PPM scheme has also been used in infrared communication by an infrared data association (IrDa) standard, high-speed optical communication, and high-speed wireless communication of ultra wide band (UWB), because reduction of power consumption is possible and speeding up is facilitated.

The PWM scheme is classified as either a single-edge modulation scheme or a double-edge modulation scheme. The single-edge modulation scheme is a modulation scheme in which either a period in which a pulse signal has a "high (H)" level or a period in which the pulse signal has a "low (L)" level is modulated. The double modulation scheme is a modulation scheme in which both the period in which the pulse signal has the "H" level and the period in which the pulse signal has the "L" level are modulated. If the double-edge modulation scheme is used, it is possible to implement higher performance (in terms of transmission rate, control responsiveness, or the like) as compared to when the single-edge modulation scheme is used. A difference between a pulse signal modulated by the single-edge scheme and a pulse signal modulated by the double-edge scheme is disclosed, for example, in Japanese Unexamined Patent Application, First Publication No. H9-84388.

In the pulse signal modulated by the double-edge modulation scheme, a pulse edge defines an end time of a certain period (for example, a period of the "H" level) and a start time of a period following the period (for example, a period of the "L" level). Thus, if a position of the pulse edge fluctuates due to noise or the like, a deviation (error) occurs in both periods before and after the pulse edge and a transmission error occurs. In addition, if the position of the pulse edge continuously fluctuates, the transmission error increases due to an accumulated deviation.

Although it is possible to remove noise of a low frequency component and a high frequency component if a band pass filter (BPF) is used, it is not possible to remove noise of the same frequency band as a frequency band of a pulse signal modulated by the double-edge modulation scheme. Thus, it is not possible to suppress the position fluctuation of the pulse edge due to noise even when the BPF is used. Although an influence of the position fluctuation of the pulse edge may be reduced if a degree of modulation is set with a margin considering the influence of noise, it is difficult to implement a high transmission rate.

SUMMARY

The present invention provides a pulse signal receiving apparatus and a transmission system capable of suppressing the occurrence of a transmission error due to the influence of noise.

A pulse signal receiving apparatus may include: a reception unit that receives a pulse signal modulated by a double-edge modulation scheme; a measurement unit that measures an edge interval of the pulse signal, which has been received by the reception unit; a detection unit that detects a deviation of the edge interval, which has been measured by the measurement unit, for a pulse-width reference value indicating a reference value of a width of the pulse signal; a correction unit that corrects the edge interval, which is to be measured next by the measurement unit, by using the deviation, which has been detected by the detection unit; and a decoding unit that decodes the pulse signal, of which the edge interval has been corrected by the correction unit, so as to output a digital signal.

The pulse signal receiving apparatus may further include: a holding unit that holds the deviation, which has been detected by the detection unit. The correction unit may correct the edge interval, which is to be measured next by the measurement unit, by using the deviation, which has been held in the holding unit.

The measurement unit may include a timer for timing the edge interval of the pulse signal, which has been received by the reception unit. The correction unit may correct the edge interval, which is to be measured next by the measurement unit, by correcting an initial value of the timer by using the deviation, which has been detected by the detection unit.

The reception unit may include: a filter unit that removes noise overlapping the received pulse signal; a shaping unit that shapes the received pulse signal; and an edge detecting unit that detects an edge position of the received pulse signal.

A transmission system for transmitting a digital signal may include: a pulse signal transmitting apparatus that transmits a pulse signal, of which a pulse width has been modulated by a double-edge modulation scheme, according to a digital signal to be transmitted; and the pulse signal receiving apparatus that receives the pulse signal, which has been transmitted from the pulse signal transmitting apparatus, the pulse signal receiving apparatus decoding the received pulse signal into a digital signal.

The transmission system may further include: a holding unit that holds the deviation, which has been detected by the detection unit. The correction unit may correct the edge interval, which is to be measured next by the measurement unit, by using the deviation, which has been held in the holding unit.

The measurement unit may include a timer for timing the edge interval of the pulse signal, which has been received by the reception unit. The correction unit may correct the edge interval, which is to be measured next by the measurement unit, by correcting an initial value of the timer by using the deviation, which has been detected by the detection unit.

The reception unit may include: a filter unit that removes noise overlapping the received pulse signal; a shaping unit that shapes the received pulse signal; and an edge detecting unit that detects an edge position of the received pulse signal.

A pulse signal receiving method may include: receiving a pulse signal modulated by a double-edge modulation scheme; measuring an edge interval of the pulse signal, which has been received; detecting a deviation of the edge interval, which has been measured, for a pulse-width reference value indicating a reference value of a width of the pulse signal; correcting the edge interval, which is to be measured next, by using the deviation, which has been detected; and decoding the pulse signal, of which the edge interval has been corrected, so as to output a digital signal.

The pulse signal receiving method may further include: holding the deviation, which has been detected; and correcting the edge interval, which is to be measured next, by using the deviation, which has been held.

The pulse signal receiving method may further include: measuring the edge interval of the pulse signal, which has been received, by using a timer; and correcting the edge interval, which is to be measured next, by correcting an initial value of the timer by using the deviation, which has been detected.

The pulse signal receiving method may further include: removing noise overlapping the received pulse signal; shaping the received pulse signal; and detecting an edge position of the received pulse signal.

In the present invention, a measurement unit measures an edge interval of a pulse signal received by a reception unit, a detection unit detects a deviation for a pulse-width reference value of the edge interval measured by the measurement unit, and a correction unit corrects the next edge interval that is measured by the measurement unit using the deviation detected by the detection unit. Thus, it is possible to suppress the occurrence of a transmission error due to the influence of noise.

BRIEF DESCRIPTION OF THE DRAWINGS

The above features and advantages of the present invention will be more apparent from the following description of certain preferred embodiments taken in conjunction with the accompanying drawings, in which:

FIG. 2 is a diagram illustrating an example of a relationship between a digital signal to be transmitted and a pulse-width reference value in accordance with the first preferred embodiment of the present invention;

FIG. 3 is a diagram illustrating an example of a relationship between a pulse width of a received pulse signal and a digital signal to be decoded in accordance with the first preferred embodiment of the present invention;

FIG. 7 is a diagram illustrating the operation of the pulse signal receiving apparatus in accordance with the second preferred embodiment of the present invention.

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

First Preferred Embodiment

Figure 1:
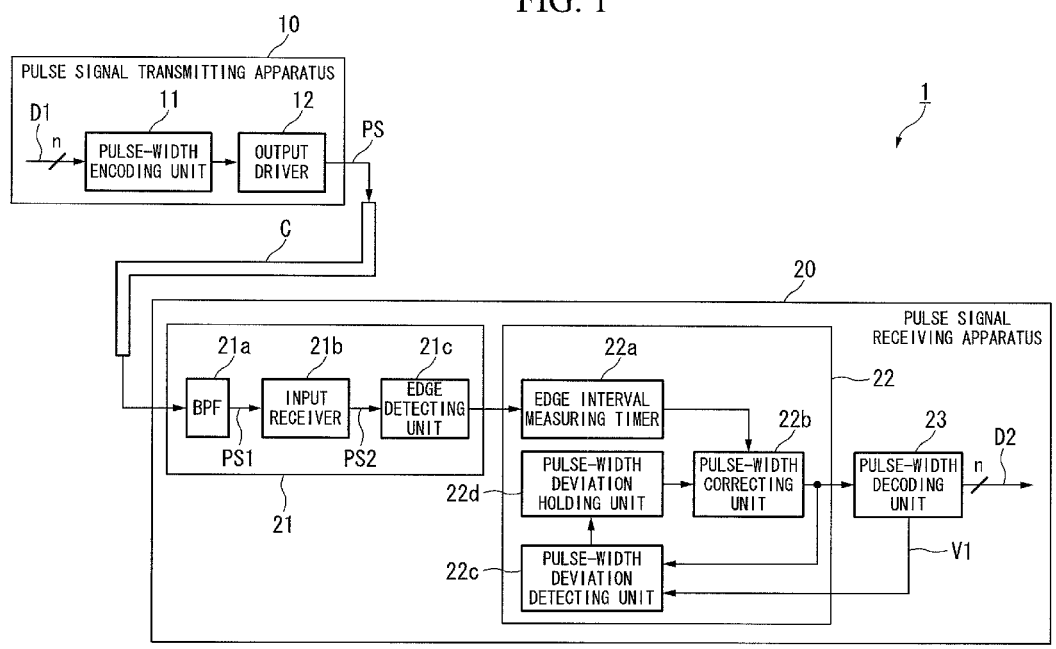
FIG. 1 is a block diagram illustrating a configuration of main parts of a pulse signal receiving apparatus and a transmission system in accordance with a first preferred embodiment of the present invention.

FIG. 1 is a block diagram illustrating a configuration of main parts of a pulse signal receiving apparatus and a transmission system in accordance with the first preferred embodiment of the present invention. As illustrated in FIG. 1, a transmission system 1 of the first preferred embodiment includes a pulse signal transmitting apparatus 10 and a pulse signal receiving apparatus 20 connected via a transmission cable C. A pulse signal PS is transmitted from the pulse signal transmitting apparatus 10 to the pulse signal receiving apparatus 20, so that a digital signal is transmitted.

The pulse signal transmitting apparatus 10 includes a pulse-width encoding unit 11 and an output driver 12. The pulse signal transmitting apparatus 10 transmits the pulse signal PS of which a pulse width has been modulated by a double-edge modulation scheme to the pulse signal receiving apparatus 20 according to a digital signal D1 to be transmitted. The pulse-width encoding unit 11 generates the pulse signal to be transmitted to the pulse signal receiving apparatus 20 on the basis of the above-described digital signal D1. Specifically, a pulse signal having a length of a period in which a signal level is the "H" level and a length of a period in which the signal level is the "L" level modulated into pulse-width reference values corresponding to the digital signal D1 is generated.

FIG. 2 is a diagram illustrating an example of a relationship between a digital signal to be transmitted and a pulse-width reference value in accordance with the first preferred embodiment of the present invention. As illustrated in FIG. 2, a pulse-width reference value indicating a reference value of a width of a pulse signal is defined to be different according to a value of the digital signal D1 to be transmitted. In the example illustrated in FIG. 2, pulse-width reference values including "600 nsec," "700 nsec," "800 nsec," and "900 nsec" are defined for values "00," "01," "10," and "11" of the digital signal D1, respectively. For simplicity of description, four types of pulse-width reference values when the digital signal D1 is 2 bits are illustrated in FIG. 2. When the digital signal D1 is n bits (where n is an integer greater than or equal to 2), $2^n$ types of pulse-width reference values are defined.

On the basis of the relationship described using FIG. 2, the pulse-width encoding unit 11 generates a pulse signal by mutually modulating the length of the period in which the signal level is the "H" level and the length of the period in which the signal level is the "L" level according to the input digital signal D1. The output driver 12 transmits the pulse signal generated by the pulse-width encoding unit 11 to the transmission cable C as the pulse signal PS.

The pulse signal receiving apparatus 20 includes a reception unit 21, a correction circuit unit 22, and a pulse-width decoding unit 23 (a decoding unit). The pulse signal receiving apparatus 20 receives the pulse signal PS transmitted from the pulse signal transmitting apparatus 10 via the transmission cable C, and decodes the pulse signal PS into a digital signal D2. The reception unit 21 includes a BPF 21*a* (a filter unit), an input receiver 21*b* (a shaping unit), and an edge detecting unit 21*c*. The reception unit 21 receives the pulse signal PS and outputs an edge detection signal indicating its edge position.

The BPF 21*a* removes a noise component of a frequency band lower than a frequency band of the received pulse signal and a noise component of a frequency band higher than the frequency band of the received pulse signal. The input receiver 21*b* shapes a waveform of a pulse signal PS1 via the BPF 21*a*. The edge detecting unit 21*c* detects an edge position of a pulse signal PS2 of which a waveform is shaped by the input receiver 21*b*, and outputs an edge detection signal indicating its detection result.

The correction circuit unit 22 includes an edge interval measuring timer 22*a* (a measurement unit), a pulse-width correcting unit 22*b* (a correction unit), a pulse-width deviation detecting unit 22*c* (a detection unit), and a pulse-width deviation holding unit 22*d* (a holding unit). The correction circuit unit 22 measures a pulse width of the pulse signal PS (more accurately, an edge interval of the pulse signal PS2 of which the waveform has been shaped by the input receiver 21*b*), and corrects a deviation of the measured pulse width. Here, the deviation of the pulse width means a variation amount (error) for the pulse-width reference value of the measured pulse width.

On the basis of the edge detection signal output from the edge detection unit 21*c* of the reception unit 21, the edge interval measuring timer 22*a* measures a pulse width that is an edge interval of the received pulse signal (the pulse signal PS2 of which the waveform has been shaped by the input receiver 21*b*). Furthermore, every time the pulse width is measured, the edge interval measuring timer 22*a* sets an initial value to "0" by clearing its measurement value (count value). The pulse-width correcting unit 22*b* corrects the pulse width measured by the edge interval measuring timer 22*a* using a pulse-width deviation held in the pulse-width deviation holding unit 22*d*.

The pulse-width deviation detecting unit 22*c* detects a deviation between an output of the pulse-width correcting unit 22*b* and a pulse-width reference value V1 output from the pulse-width decoding unit 23. Here, the output of the pulse-width correcting unit 22*b* is the pulse width measured by the edge interval measuring timer 22*a* or the pulse width measured by the edge interval measuring timer 22*a* corrected using the pulse-width deviation held in the pulse-width deviation holding unit 22*d*. In addition, the pulse-width reference value V1 output from the pulse-width decoding unit 23 is a pulse-width reference value corresponding to the output of the pulse-width correcting unit 22*b*. Thus, the pulse-width deviation detecting unit 22*c* detects a deviation for a pulse-width reference value of the pulse width measured by the edge interval measuring timer 22*a* (or the corrected pulse width). The pulse-width deviation holding unit 22*d* holds the pulse-width deviation detected by the pulse-width deviation detecting unit 22*c* until the next pulse-width deviation is output from the pulse-width deviation detecting unit 22*c*.

The pulse-width decoding unit 23 decodes the digital signal D2 on the basis of the output of the pulse-width correcting unit 22*b* provided in the correction circuit unit 22, and outputs the pulse-width reference value V1 corresponding to the output of the pulse-width correcting unit 22*b* (corresponding to the decoded digital signal D2). FIG. 3 is a diagram illustrating an example of a relationship between a pulse width of a received pulse signal and a digital signal to be decoded in accordance with the first preferred embodiment of the present invention. As illustrated in FIG. 3, a plurality of determination areas, which do not overlap a pulse width output from the pulse-width correcting unit 22*b* provided in the correction circuit unit 22, are set, and the digital signal D2 to be decoded is allocated to each of the determination areas.

In the example illustrated in FIG. 3, four determination areas each having a width of 100 [nsec] are set on the basis of pulse-width reference values described using FIG. 2. Specifically, a first determination area R1 of 550≤W<650, a second determination area R2 of 650≤W<750, a third determination area R3 of 750≤W<850, and a fourth determination area R4 of 850≤W<950 are set for a pulse width W [nsec] output from the pulse-width correcting unit 22*b*.

Values "00," "01," "10," and "11" of the digital signal D2 are allocated to the above-described first to fourth determination areas R1 to R4, respectively. Furthermore, when the pulse width W is less than 550 [nsec] or when the pulse width W is greater than or equal to 950 [nsec], a "bit error" is defined. Thus, for example, when the output of the pulse-width correcting unit 22*b* indicates a pulse width of 940 [nsec], the pulse-width decoding unit 23 outputs the value "11" of the digital signal D2 and outputs a pulse-width reference value [900] corresponding to the digital signal D2 as the pulse-width reference value V1.

Figure 4:
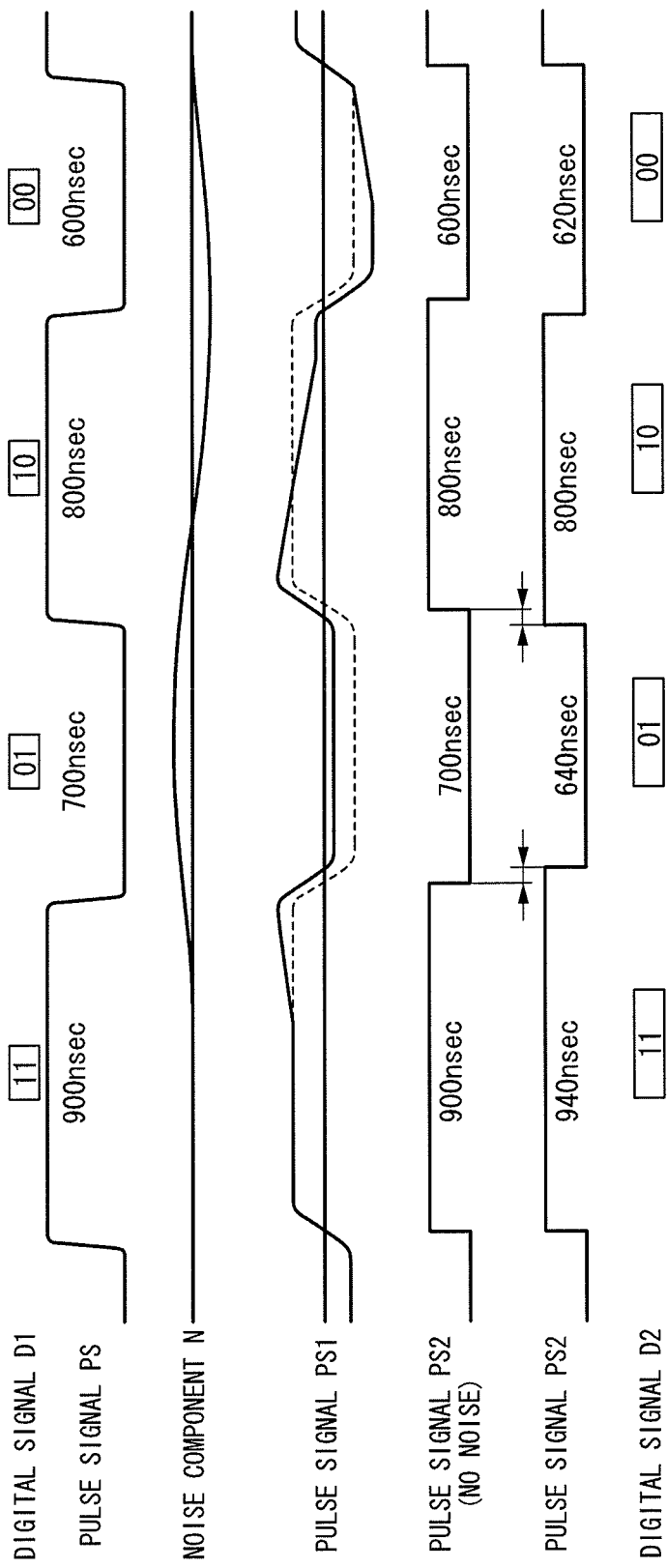
FIG. 4 is a timing chart illustrating a signal to be transmitted by the transmission system in accordance with the first preferred embodiment of the present invention.

Next, an operation of the transmission system 1 in the above-described configuration will be described. FIG. 4 is a timing chart illustrating a signal to be transmitted by the transmission system in accordance with the first preferred embodiment of the present invention. First, if a digital signal D1 including "11," "01," "10," and "00" is sequentially input to the pulse-width encoding unit 11 provided in the pulse signal transmitting apparatus 10, a pulse signal of which a pulse width has been modulated is generated according to the relationship described using FIG. 2, and transmitted to the transmission cable C via the output driver 12 as a pulse signal PS.

Specifically, as illustrated in FIG. 4, according to the modulation performed by the pulse-width encoding unit 11, a pulse signal PS in which a length of a period of a first "H" level is "900 nsec," a length of a period of an "L" level continuous thereto is "700 nsec," a length of a period of the "H" level continuous thereto is "800 nsec," and a length of a period of the "L" level continuous thereto is "600 nsec" is generated and transmitted to the transmission cable C. This pulse signal PS is propagated to the pulse signal receiving apparatus 20 through the transmission cable C.

Here, it is assumed that the pulse signal PS is affected by an extraneous noise component N illustrated in FIG. 4 while the pulse signal PS is propagated through the transmission cable C. Then, the pulse signal PS overlapping the noise component N is received by the reception unit 21 of the pulse signal receiving apparatus 20, and a pulse signal PS1 indicated by a solid line in FIG. 4 is output from the BPF 21*a*. Furthermore, for a comparison, a pulse signal PS1 output from the BPF 21*a* when the influence of the noise component N is absent is indicated by a dashed line in FIG. 4.

When the influence of the noise component N is absent, the same pulse signal PS2 as the pulse signal PS transmitted from the pulse signal transmitting apparatus 10 to the transmission cable C is output from the input receiver 21*b* provided in the reception unit 21. That is, the pulse signal PS2 of which the pulse width varies in the order of "900 nsec," "700 nsec," "800 nsec," and "600 nsec" is output. On the other hand, when the influence of the noise component N has been received, a pulse signal PS2 in which an initial period is lengthened and varied to "940 nsec," a second period is shortened and varied to "640 nsec," and a fourth period is also varied to "620 nsec" is output from the input receiver 21b provided in the reception unit 21.

When the influence of the noise component N is absent, pulse widths sequentially measured by the edge interval measuring timer 22a provided in the correction circuit unit 22 of the pulse signal receiving apparatus 20 are equal to "900 nsec," "700 nsec," "800 nsec," and "600 nsec." Thus, the pulse-width deviation detected by the pulse-width deviation detecting unit 22c of the correction circuit unit 22 becomes "0." Then, the pulse width measured by the edge interval measuring timer 22a is output to the pulse-width decoding unit 23 without being corrected by the pulse-width correcting unit 22b, and the digital signal D2 including "11," "01," "10," and "00" identical with the digital signal D1 is output from the pulse-width decoding unit 23.

On the other hand, when the influence of the noise component N has been received, the pulse width measured by the edge interval measuring timer 22a provided in the correction circuit unit 22 may be varied from the pulse-width reference value. The pulse signal receiving apparatus 20 of the first preferred embodiment suppresses the occurrence of a transmission error even when the noise component N overlaps the pulse signal PS transmitted from the pulse signal transmitting apparatus 10 by correcting the variation (deviation) as described above in the correction circuit unit 22. Hereinafter, an operation of the pulse signal receiving apparatus 20 when the pulse signal PS overlapping the noise component N has been received will be described in detail.

Figure 5:
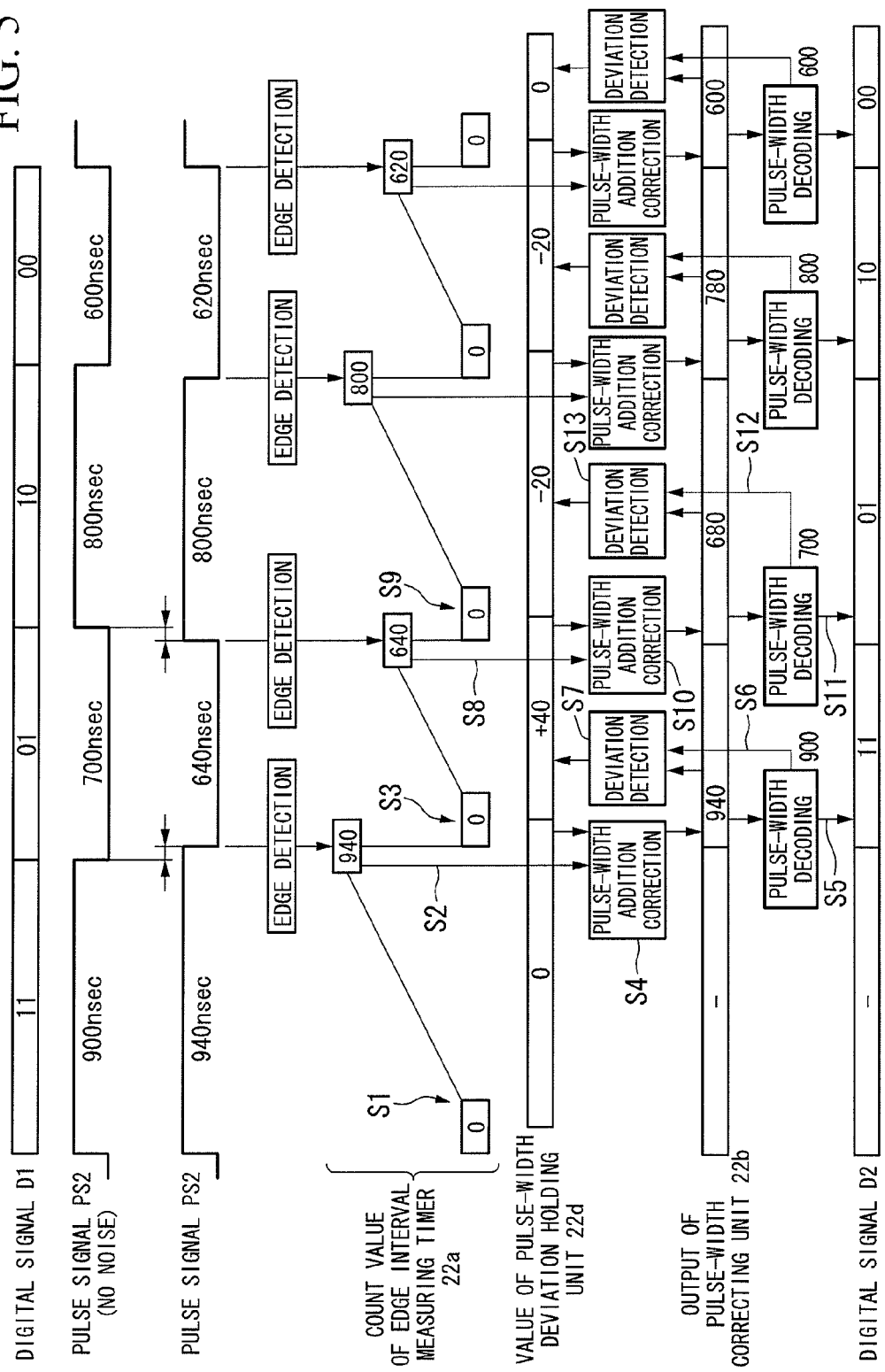
FIG. 5 is a diagram illustrating the operation of the pulse signal receiving apparatus in accordance with the first preferred embodiment of the present invention.

FIG. 5 is a diagram illustrating the operation of the pulse signal receiving apparatus in accordance with the first preferred embodiment of the present invention. First, if an edge detection signal is input from the reception unit 21 to the edge interval measuring timer 22a of which a count value is initialized to "0," a count operation of the edge interval measuring timer 22a is initiated (step S1). If the next edge detection signal is output from the reception unit 21 while the count operation of the edge interval measuring timer 22a is performed, the count operation of the edge interval measuring timer 22a is stopped and its count value (a count value indicating a pulse width "940 nsec") is output to the pulse-width correcting unit 22b (step S2). Furthermore, if a count value is output from the edge interval measuring timer 22a, the count value is cleared and the count operation is resumed after the initial value is set to "0" (step S3).

If the count value of the edge interval measuring timer 22a is input, the pulse-width correcting unit 22b corrects the input count value using a pulse-width deviation held in the pulse-width deviation holding unit 22d (step S4). As illustrated in FIG. 5, because an initial value of the pulse-width deviation held in the pulse-width deviation holding unit 22d is "0," an output of the pulse-width correcting unit 22b becomes a value indicating the pulse width "940 nsec" measured by the edge interval measuring timer 22a. The output of the pulse-width correcting unit 22b is input to the pulse-width decoding unit 23 and decoded into a digital signal D2 including "11" (step S5).

That is, because the value indicating the pulse width "940 nsec" included in the fourth determination area R4 illustrated in FIG. 3 is output from the pulse-width correcting unit 22b, the pulse-width decoding unit 23 outputs the digital signal D2 including "11." In addition, the pulse-width reference value "900" corresponding to the digital signal D2 including "11" is output from the pulse-width decoding unit 23 as the pulse-width reference value V1 (step S6). Then, the pulse-width deviation detecting unit 22c detects a deviation between the output of the pulse-width correcting unit 22b and the pulse-width reference value V1 output from the pulse-width decoding unit 23 (step S7), and the deviation "+40" is held in the pulse-width deviation holding unit 22d.

If the next edge detection signal is output from the reception unit 21 to the edge interval measuring timer 22a, the count operation of the edge interval measuring timer 22a is stopped and its count value (a count value indicating a pulse width "640 nsec") is output to the pulse-width correcting unit 22b (step S8). Furthermore, if a count value is output from the edge interval measuring timer 22a, the count value is re-cleared and the count operation is resumed after the initial value is set to "0" (step S9).

If the count value of the edge interval measuring timer 22a is input, the pulse-width correcting unit 22b corrects the input count value using a pulse-width deviation held in the pulse-width deviation holding unit 22d (step S10). As illustrated in FIG. 5, because the pulse-width deviation "+40" is held in the pulse-width deviation holding unit 22d, an output of the pulse-width correcting unit 22b becomes a value "680 nsec" obtained by adding the deviation "+40" to the pulse width "640 nsec" measured by the edge interval measuring timer 22a. The output of the pulse-width correcting unit 22b is input to the pulse-width decoding unit 23 and decoded into a digital signal D2 including "01" from the relationship illustrated in FIG. 3 (step S11).

In addition, the pulse-width reference value "700" corresponding to the digital signal D2 including "01" is output from the pulse-width decoding unit 23 as the pulse-width reference value V1 (step S12). Then, the pulse-width deviation detecting unit 22c detects a deviation between the output of the pulse-width correcting unit 22b and the pulse-width reference value V1 output from the pulse-width decoding unit 23 (step S13), and the deviation "Δ20" is held in the pulse-width deviation holding unit 22d.

Thereafter, the same operation is iterated and the digital signal D2 including "10" and "00" is continuously sequentially output from the pulse-width decoding unit 23. Then, the pulse signal receiving apparatus 20 obtains the digital signal D2 including "11," "01," "10," and "00" identical with the output digital signal D2 when the influence of the noise component N is absent (or the digital signal D2 identical with the digital signal D1), so that it can be seen that no transmission error occurs even when there is the influence of the noise component N.

As described above, in the first preferred embodiment, the pulse width (edge interval) of the pulse signal PS2 received by the reception unit 21 is measured, a deviation for a pulse-width reference value of the measured pulse width is detected and held, and the next pulse width that is measured is corrected using the held deviation, so that fluctuations of front and rear pulse widths are canceled out. Thereby, it is possible to suppress the occurrence of a transmission error due to the influence of the noise component N even when the noise component N overlaps the pulse signal PS propagated through the transmission cable C. As a result, it is also possible to improve the transmission rate of the transmission system 1.

Second Preferred Embodiment

Figure 6:
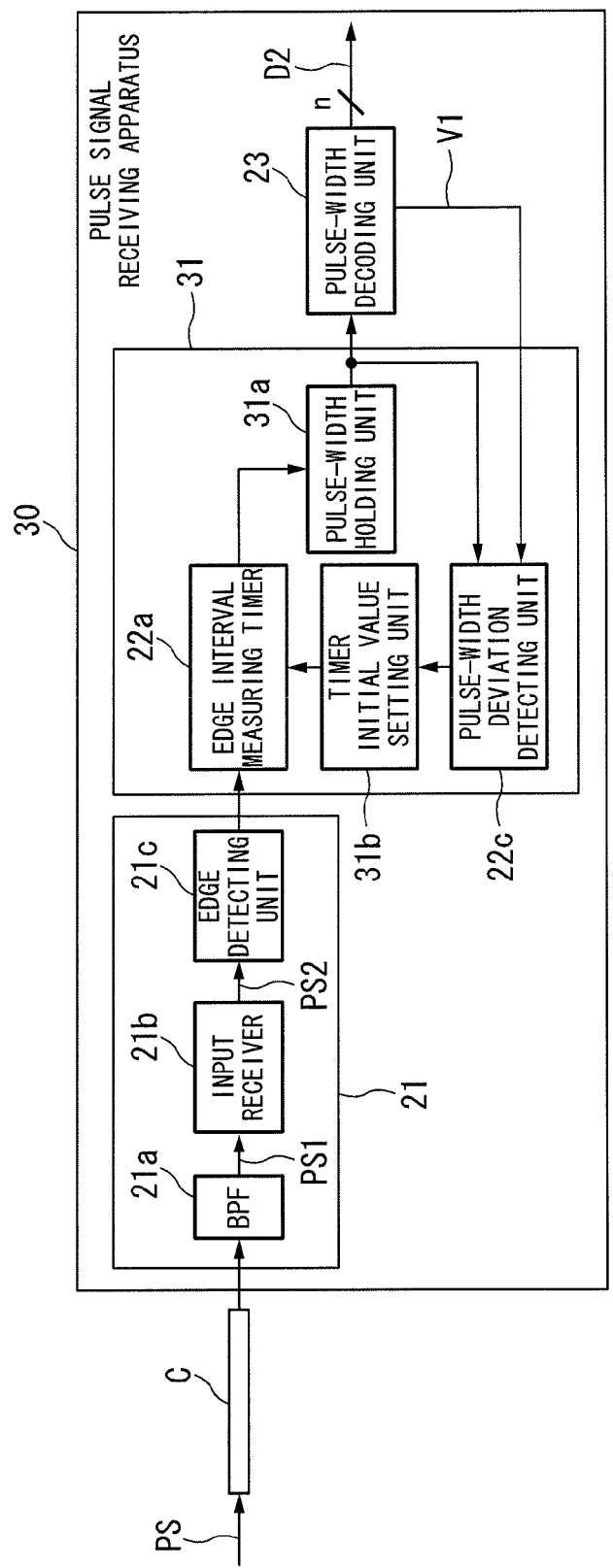
FIG. 6 is a block diagram illustrating a configuration of main parts of a pulse signal receiving apparatus in accordance with a second preferred embodiment of the present invention.

FIG. 6 is a block diagram illustrating a configuration of main parts of a pulse signal receiving apparatus in accordance with the second preferred embodiment of the present invention. As illustrated in FIG. 6, the pulse signal receiving apparatus 30 of the second preferred embodiment includes a correction circuit unit 31 in place of the correction circuit unit 22 of the pulse signal receiving apparatus 20 illustrated in FIG. 1. The correction circuit unit 31 includes the edge interval measuring timer 22a and the pulse-width deviation detecting unit 22c provided in the correction circuit unit 22, a pulse-width holding unit 31a, and a timer initial value setting unit 31b (a correction unit). The pulse-width holding unit 31a holds a pulse width output from the edge interval measuring timer 22a until the next pulse width is output from the edge interval measuring timer 22a. The timer initial value setting unit 31b sets an initial value of the edge interval measuring timer 22a using a deviation detected by the pulse-width deviation detecting unit 22c.

In the correction circuit unit 22 provided in the pulse signal receiving apparatus 20 of the first preferred embodiment described above, the pulse-width deviation holding unit 22d holds the deviation detected by the pulse-width deviation detecting unit 22c and the pulse-width correcting unit 22b corrects the next pulse width that is measured by the edge interval measuring timer 22a according to the held deviation. On the other hand, in the correction circuit unit 31 provided in the pulse signal receiving apparatus 30 of the second preferred embodiment, the timer initial value setting unit 31b corrects an initial value of the edge interval measuring timer 22a using the deviation detected by the pulse-width deviation detecting unit 22c and the next pulse width that is measured by the edge interval measuring timer 22a is corrected according to the corrected initial value.

Next, an operation of the pulse signal receiving apparatus 30 in the above-described configuration will be described in detail. FIG. 7 is a diagram illustrating the operation of the pulse signal receiving apparatus in accordance with the second preferred embodiment of the present invention. First, as in the first preferred embodiment, if an edge detection signal is input from the reception unit 21 to the edge interval measuring timer 22a of which a count value is initialized to "0," a count operation of the edge interval measuring timer 22a is initiated (step S21). If the next edge detection signal is output from the reception unit 21, the count operation of the edge interval measuring timer 22a is stopped and its count value (a count value indicating a pulse width "940 nsec") is output and held in the pulse-width holding unit 31a (step S22).

A pulse width held in the pulse-width holding unit 31a is output to the pulse-width decoding unit 23 and decoded into a digital signal D2 including "11" (step S23). In addition, the pulse-width reference value "900" corresponding to the digital signal D2 including "11" is output from the pulse-width decoding unit 23 as the pulse-width reference value V1 (step S24). Then, the pulse-width deviation detecting unit 22c detects a deviation between the output of the pulse-width holding unit 31a and the pulse-width reference value V1 output from the pulse-width decoding unit 23 (step S25), and the deviation "+40" is set to an initial value of the edge interval measuring timer 22a by the timer initial value setting unit 31b (step S26). When the initial value is set, the count operation of the edge interval measuring timer 22a is resumed.

If the next edge detection signal is output from the reception unit 21 to the edge interval measuring timer 22a, the count operation of the edge interval measuring timer 22a is stopped and its count value is output and held in the pulse-width holding unit 31a (step S27). Here, the count value counted by the edge interval measuring timer 22a originally indicates a pulse width "640 nsec." However, because the initial value is set to "+40" in the above-described process of step S26, the count value held in the pulse-width holding unit 31a becomes "680 nsec" obtained by adding the deviation "+40" to the pulse width "640 nsec."

The pulse width held in the pulse-width holding unit 31a is output to the pulse-width decoding unit 23 and decoded into the digital signal D2 including "01" (step S28). In addition, the pulse-width reference value "700" corresponding to the digital signal D2 including "01" is output from the pulse-width decoding unit 23 as the pulse-width reference value V1 (step S29). Then, the pulse-width deviation detecting unit 22c detects a deviation between the output of the pulse-width holding unit 31a and the pulse-width reference value V1 output from the pulse-width decoding unit 23 (step S30), and the deviation "−20" is set to the initial value of the edge interval measuring timer 22a by the timer initial value setting unit 31b (step S31). If the initial value is set, the count operation of the edge interval measuring timer 22a is resumed.

Thereafter, the same operation is iterated and the digital signal D2 including "10" and "00" is continuously sequentially output from the pulse-width decoding unit 23. Then, like the pulse signal receiving apparatus 20 of the first preferred embodiment, the pulse signal receiving apparatus 30 obtains the digital signal D2 including "11," "01," "10," and "00" identical with the output digital signal D2 when the influence of the noise component N is absent (or the digital signal D2 identical with the digital signal D1), so that it can be seen that no transmission error occurs even when there is the influence of the noise component N.

As described above, in the second preferred embodiment, the pulse width (edge interval) of the pulse signal PS2 received by the reception unit 21 is measured, a deviation for a pulse-width reference value of the measured pulse width is detected, an initial value of the edge interval measuring timer 22a is corrected using the deviation, and the next pulse width that is measured is corrected, so that fluctuations of front and rear pulse widths are canceled out. Thereby, it is possible to suppress the occurrence of a transmission error due to the influence of the noise component N even when the noise component N overlaps the pulse signal PS propagated through the transmission cable C as in the first preferred embodiment. As a result, it is also possible to improve a transmission rate of the transmission system 1.

Although the pulse signal receiving apparatus and the transmission system in accordance with the preferred embodiments of the present invention have been described above, the present invention is not limited to the above-described preferred embodiments and free changes are possible within the scope of the present invention. For example, although an example in which the correction circuit units 22 and 31, the pulse-width decoding unit 23, and so on of the pulse signal receiving apparatuses 20 and 30 are constituted by hardware has been described in the above-described preferred embodiment, these may be implemented by software.

In addition, an example in which a 2-bit digital signal D1 is transmitted has been described for simplicity of description in the above-described preferred embodiments. However, the number of bits of the digital signal D1 to be transmitted is not limited to 2, and it is possible to transmit a digital signal D1 having any number of bits. In addition, an example in which a pulse-width reference value indicating a reference signal of a width of a pulse signal is set to a linearly variable value has been described in the above-described preferred embodiment. However, the pulse-width reference value may be set to a non-linearly variable value.

The term "configured" is used to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, section or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A pulse signal receiving apparatus comprising:
a reception unit configured to receive a pulse signal modulated by a double-edge modulation scheme, the pulse signal including a first edge interval and a second edge interval, the second edge interval following the first edge interval;
a measurement unit configured to measure the first and second edge intervals of the pulse signal, which has been received by the reception unit;
a correction unit configured to correct the first edge interval, which has been measured by the measurement unit, by using a first value;
a decoding unit configured to decode the pulse signal, of which the first edge interval has been corrected by the correction unit, so as to output a digital signal; and
a detection unit configured to detect, as a second value, a deviation of the first edge interval, which has been corrected by the correction unit, the deviation being for a pulse-width reference value indicating a reference value of a width of the pulse signal,
wherein the correction unit is configured to correct the second edge interval, which has been measured by the measurement unit, by using the second value.

2. The pulse signal receiving apparatus according to claim 1, further comprising:
a holding unit configured to hold the deviation, which has been detected by the detection unit,
wherein the correction unit is configured to correct the second edge interval, which has been measured by the measurement unit, by using the deviation, which has been held in the holding unit.

3. The pulse signal receiving apparatus according to claim 1, wherein
the measurement unit comprises a timer for timing the first and second edge intervals of the pulse signal, which has been received by the reception unit, and
the correction unit is configured to correct the second edge interval, which has been measured by the measurement unit, by correcting an initial value of the timer by using the deviation, which has been detected by the detection unit.

4. The pulse signal receiving apparatus according to claim 1, wherein the reception unit comprises:
a filter unit configured to remove noise overlapping the received pulse signal;
a shaping unit configured to shape the received pulse signal; and
an edge detecting unit configured to detect an edge position of the received pulse signal.

5. A transmission system for transmitting a digital signal, comprising:

a pulse signal transmitting apparatus configured to transmit a pulse signal, of which a pulse width has been modulated by a double-edge modulation scheme, according to a digital signal to be transmitted; and
the pulse signal receiving apparatus according to claim 1, the pulse signal receiving apparatus is configured to receive the pulse signal, which has been transmitted from the pulse signal transmitting apparatus, the pulse signal receiving apparatus decoding the received pulse signal into a digital signal.

6. The transmission system according to claim 5, further comprising:
a holding unit configured to hold the deviation, which has been detected by the detection unit,
wherein the correction unit is configured to correct the second edge interval, which has been measured by the measurement unit, by using the deviation, which has been held in the holding unit.

7. The transmission system according to claim 5, wherein
the measurement unit comprises a timer for timing the first and second edge intervals of the pulse signal, which has been received by the reception unit, and
the correction unit is configured to correct the second edge interval, which has been measured by the measurement unit, by correcting an initial value of the timer by using the deviation, which has been detected by the detection unit.

8. The transmission system according to claim 5, wherein the reception unit comprises:
a filter unit configured to remove noise overlapping the received pulse signal;
a shaping unit configured to shape the received pulse signal; and
an edge detecting unit configured to detect an edge position of the received pulse signal.

9. The pulse signal receiving apparatus according to claim 1, wherein
in the first edge interval, the pulse signal has one of a high level and a low level, and
in the second edge interval, the pulse signal has the other of the high level and the low level.

10. The pulse signal receiving apparatus according to claim 1, further comprising:
a holding unit configured to hold the second deviation, which has been detected by the detection unit, as the second value,
wherein the correction unit is configured to correct the second edge interval, which has been measured by the measurement unit, by using the second value that has been held by the holding unit.

11. The pulse signal receiving apparatus according to claim 1, further comprising:
a pulse-width holding unit configured to hold the first edge interval that has been measured by the measurement unit; and
a timer initial value setting unit configured to set the second value, which is the second deviation that has been detected by the detection unit, as an initial value of an edge interval measuring timer of the measurement unit.

12. A pulse signal receiving method comprising:
receiving a pulse signal modulated by a double-edge modulation scheme, the pulse signal including a first edge interval and a second edge interval, the second edge interval following the first edge interval;
measuring the first and second edge intervals of the pulse signal, which has been received;

correcting the first edge interval, which has been measured, by using a first value;

decoding the pulse signal, of which the first edge interval has been corrected, so as to output a digital signal;

detecting, as a second value, a deviation of the first edge interval, which has been corrected, the second deviation being for a pulse-width reference value indicating a reference value of a width of the pulse signal; and correcting the second edge interval, which has been measured, by using the second value.

13. The pulse signal receiving method according to claim 12, further comprising:

holding the deviation, which has been detected; and correcting the second edge interval, which has been measured, by using the deviation, which has been held.

14. The pulse signal receiving method according to claim 12, further comprising:

measuring the first and second edge intervals of the pulse signal, which has been received, by using a timer; and correcting the second edge interval, which has been measured, by correcting an initial value of the timer by using the deviation, which has been detected.

15. The pulse signal receiving method according to claim 12, further comprising:

removing noise overlapping the received pulse signal;

shaping the received pulse signal; and detecting an edge position of the received pulse signal.

\* \* \* \* \*